(12) United States Patent
Bekman et al.

(10) Patent No.: US 10,690,812 B2
(45) Date of Patent: Jun. 23, 2020

(54) OPTICAL ELEMENT AND OPTICAL SYSTEM FOR EUV LITHOGRAPHY, AND METHOD FOR TREATING SUCH AN OPTICAL ELEMENT

(71) Applicants: Carl Zeiss SMT GmbH, Oberkochen (DE); ASML Netherlands B.V., Veldhoven (NL)

(72) Inventors: Hermanus Hendricus Petrus Theodorus Bekman, Purmerend (NL); Dirk Heinrich Ehm, Lauchheim (DE); Jeroen Huijbregtse, Breda (NL); Arnoldus Jan Storm, Delft (NL); Tina Graber, Oberkochen (DE); Irene Ament, Aalen (DE); Dries Smeets, Hasselt (BE); Edwin Te Sligte, Eindhoven (NL); Alexey Kuznetsov, Culemborg (NL)

(73) Assignees: CARL ZEISS SMT GMBH, Oberkochen (DE); ASML NETHERLANDS B.V., Veldhoven (NL)

( * ) Notice: Subject to any disclaimer, the term of this patent is extended or adjusted under 35 U.S.C. 154(b) by 1113 days.

(21) Appl. No.: 14/854,784

(22) Filed: Sep. 15, 2015

(65) Prior Publication Data
US 2016/0187543 A1 Jun. 30, 2016

Related U.S. Application Data

(63) Continuation of application No. PCT/EP2014/050471, filed on Jan. 13, 2014.
(Continued)

(30) Foreign Application Priority Data

Mar. 15, 2013 (DE) .................. 10 2013 102 670

(51) Int. Cl.
*G02B 1/14* (2015.01)
*G02B 5/08* (2006.01)
(Continued)

(52) U.S. Cl.
CPC ................ *G02B 1/14* (2015.01); *C23C 16/56* (2013.01); *G02B 5/0891* (2013.01);
(Continued)

(58) Field of Classification Search
CPC .............................. G02B 5/0891; G02B 5/283
(Continued)

(56) References Cited

U.S. PATENT DOCUMENTS 4,439,870 A 3/1984 Poulsen et al.
9,472,313 B2 * 10/2016 Silova .................... B82Y 10/00
(Continued)

FOREIGN PATENT DOCUMENTS

DE 102009054653 A1 6/2011
DE 102011076011 A1 11/2012
(Continued)

OTHER PUBLICATIONS

Madey et. al. "Surface phenomena related to mirror degradation in extreme ultraviolet (EUV) lithography", Applied surface science, 253, 1691-1708.*
(Continued)

*Primary Examiner* — Robert E. Tallman
(74) *Attorney, Agent, or Firm* — Edell, Shapiro & Finnan, LLC

(57) ABSTRACT

An optical element (50), comprising: a substrate (52), an EUV radiation reflecting multilayer system (51) applied to the substrate, and a protective layer system (60) applied to the multilayer system and having at least a first and a second layer (57, 58). The first layer (57) is arranged closer to the multilayer system (51) than is the second layer (58) and
(Continued)

serves as a diffusion barrier for hydrogen. This first layer (57) has a lower solubility for hydrogen than does the second layer (58), which serves for absorbing hydrogen. Also disclosed are an optical system for EUV lithography with at least one such optical element, and a method for treating an optical element in order to remove hydrogen incorporated in at least one layer (57, 58, 59) of the protective layer system and/or in at least one layer (53, 54) of the multilayer system (51).

17 Claims, 3 Drawing Sheets

Related U.S. Application Data

(60) Provisional application No. 61/792,638, filed on Mar. 15, 2013.

(51) Int. Cl.
  *G21K 1/06* (2006.01)
  *G03F 7/20* (2006.01)
  *C23C 16/56* (2006.01)

(52) U.S. Cl.
  CPC ........ *G03F 7/7015* (2013.01); *G03F 7/70316* (2013.01); *G03F 7/70916* (2013.01); *G03F 7/70925* (2013.01); *G03F 7/70958* (2013.01); *G03F 7/70983* (2013.01); *G21K 1/062* (2013.01)

(58) Field of Classification Search
  USPC .................................................. 359/359, 360
  See application file for complete search history.

(56) References Cited

U.S. PATENT DOCUMENTS

| | | | |
|---|---|---|---|
| 2002/0084425 A1 | 7/2002 | Klebanoff et al. | |
| 2003/0008180 A1* | 1/2003 | Bajt ..................... | B82Y 10/00 428/698 |
| 2004/0002009 A1* | 1/2004 | Yan ....................... | B82Y 10/00 430/5 |
| 2006/0127780 A1* | 6/2006 | Chandhok ............. | B82Y 10/00 430/5 |
| 2008/0149854 A1 | 6/2008 | Van Herpen et al. | |
| 2010/0239822 A1 | 9/2010 | Pelizzo et al. | |
| 2011/0228237 A1 | 9/2011 | Trenkler et al. | |
| 2012/0013976 A1 | 1/2012 | Weber | |
| 2014/0154837 A1* | 6/2014 | Yamazaki ........... | H01L 29/7869 438/104 |
| 2014/0199543 A1 | 7/2014 | Ehm et al. | |

FOREIGN PATENT DOCUMENTS

| | | |
|---|---|---|
| JP | S58115739 A | 7/1983 |
| JP | 2004517484 A | 6/2004 |
| JP | 2005516182 A | 6/2005 |
| JP | 2006173490 A | 6/2006 |
| JP | 20060173490 A | 6/2006 |
| JP | 201092503 A | 9/2010 |

OTHER PUBLICATIONS

Holleck, "Solubility of hydrogen in palladium and palladium-silver alloys", Journal of Physical chemistry, vo91.74. No. 3, 503-511 (Year: 1970).*

Eguchi, "Solubility of Hydrogen in Molybdenum and its alloys:, Journal of the Japan Institute of Metals and Materials", vol. 38, No. 11, 1019-1025 (Year: 1973).*

Office Action in corresponding Chinese Application 201480016112. 4, dated Aug. 31, 2016, along with English translation.

Fowler et al., "A Theoretical Formula for the Solubility of Hydrogen in Metals", Proceedings of the Royal Society of London, Series A, Mathematical and Physical Sciences, May 1, 1937.

Office Action in corresponding Japanese Application 2015561983, dated Jan. 9, 2018, along with English Translation.

International Search Report and Written Opinion in counterpart International Application No. PCT/EP2014/050471, dated Jul. 11, 2014.

REB Research and Consulting, "The solubility of hydrogen in aluminum, cobalt, copper, iron . . . ", May 27, 2010, http://www.rebresearch.com/H2so12.htm.

Takeshita, T. et al., "Hydrogen solubility in 1:5 compounds . . . ", Inorganic Chemistry, vol. 13, No. 9, Sep. 1, 1974, p. 2282-2283.

Office Action in corresponding German Application No. 10 2013 102 670.2, dated Jul. 8, 2013, along with an English translation.

Fowler R. H., et al., "A Theoretical Formula for the Solubility of Hydrogen in Metals", Proceedings of the Royal Society of London. Series A, Mathematical and Physical Sciences, vol. 160, No. 900 (May 1, 1937), pp. 37-47.

Pick M.A., et al., "A Model for Atomic Hydrogen-metal Interactions", Journal of Nuclear Materials 131, 1985, pp. 208-220.

Razdobarin A. G. et al., "High Reflective Mirrors for Invessel Applications in ITER", Nuclear Instruments and Methods in Physics Research, A623, 2010, 809-811.

KIPO Notice of Preliminary Rejection with English Translation, dated Feb. 25, 2020, 12 pages.

* cited by examiner

OPTICAL ELEMENT AND OPTICAL SYSTEM FOR EUV LITHOGRAPHY, AND METHOD FOR TREATING SUCH AN OPTICAL ELEMENT

CROSS REFERENCE TO RELATED APPLICATIONS

This application is a Continuation of International Application No. PCT/EP2014/050471, filed Jan. 13, 2014, which claims priority under 35 U.S.C. § 119(a) to German Patent Application No. 10 2013 102 670.2 filed on Mar. 15, 2013, and which claims benefit under 35 U.S.C. § 119(e) to U.S. Provisional Application No. 61/792,638 also filed on Mar. 15, 2013. The entire disclosures of all three related applications are considered part of and are incorporated by reference into the disclosure of the present application in their respective entireties.

FIELD OF THE INVENTION

The invention relates to an optical element, comprising: a substrate, an EUV radiation reflecting multilayer system applied to the substrate, and a protective layer system applied to the multilayer system and having at least a first and a second layer, wherein the first layer is arranged closer to the multilayer system than the second layer. The first layer can be arranged, in particular, adjacent to the multilayer system. The invention also relates to an optical system for EUV lithography which comprises at least one such optical element, and to a method for treating an optical element for EUV lithography.

BACKGROUND

In EUV lithography apparatuses, reflective optical elements for the extreme ultraviolet (EUV) wavelength range (at wavelengths of between approximately 5 nm and approximately 20 nm) such as, for instance, photomasks or mirrors based on reflective multilayer systems are used for producing semiconductor components. Since EUV lithography apparatuses generally have a plurality of reflective optical elements, the latter have to have a highest possible reflectivity in order to ensure a sufficiently high total reflectivity. The reflectivity and the lifetime of the reflective optical elements can be reduced by contamination of the optically used surfaces of the reflective optical elements, which arises on account of the short-wave irradiation together with residual gases in the operating atmosphere. Since a plurality of reflective optical elements are usually arranged one behind another in an EUV lithography apparatus, even relatively small contaminations on each individual reflective optical element affect the total reflectivity to a relatively large extent.

Contamination can occur on account of moisture residues, for example. In this case, water molecules are dissociated by the EUV radiation and the resulting free oxygen radicals oxidize the optically active surfaces of the reflective optical elements. A further source of contamination is polymers, which can originate for example from the vacuum pumps used in EUV lithography apparatuses, or from residues of photoresists which are used on the semiconductor substrates to be patterned, and which lead under the influence of the operating radiation to carbon contaminations on the reflective optical elements. While oxidative contaminations are generally irreversible, carbon contaminations, in particular, can be removed, inter alia, by treatment with reactive hydrogen, by virtue of the reactive hydrogen reacting with the carbon-containing residues to form volatile compounds. The reactive hydrogen can be hydrogen radicals or else ionized hydrogen atoms or molecules.

If the light source provided in the EUV lithography apparatus generates EUV radiation on the basis of a tin plasma, tin and, if appropriate, zinc or indium compounds (or generally metal (hydride) compounds) occur in the vicinity of the light source and can attach to the optically used surface of, for example, a collector mirror. Since these substances generally have a high absorption for EUV radiation, deposits of these substances on the optically used surfaces lead to a high loss of reflectivity, for which reason these substances should be removed with the aid of suitable cleaning methods, for example with the aid of reactive (atomic) hydrogen or with the aid of a hydrogen plasma. Hydrogen can also be used to protect the optical surfaces arranged in the region of the light source against sputtering or etching away by tin ions. In this case, a hydrogen plasma is typically likewise generated on account of the EUV radiation present and the interaction of the hydrogen with ions and electrons. Optical elements in the vicinity of the light source or the reflective multilayer systems thereof should therefore also be stable in relation to degradation if they are permanently exposed to hydrogen plasma.

In order to protect a reflective multilayer system against degradation, it is known to apply a protective layer system to the multilayer system. Degradation is understood to mean contamination effects such as e.g. the growth of a carbon layer, oxidation, metal depositions, etc., but also the delamination of individual layers, the etching away or sputtering of layers, etc. In particular, it has been observed that under the influence of reactive hydrogen which is used for cleaning or which can arise on account of the interaction of the EUV radiation with hydrogen present in the residue atmosphere, detachment of individual layers, in particular close to the surface of the multilayer system, can occur.

US 2011/0228237 A1 discloses providing, for the purpose of protecting the reflective multilayer system, a protective layer system comprising at least two layers, of which one layer comprises a material selected from the group $SiO_2$, $Y_2O_3$ and $ZrO_2$ and a further layer comprises a material selected from a group comprising silicon oxide (having different stoichiometric ratios), Y and ZrO.

DE 10 2011 076 011 A1 discloses an optical element for reflecting EUV radiation comprising a protective layer system having a topmost layer composed of silicon carbide or ruthenium, wherein the protective layer system has a thickness of between 5 nm and 25 nm. At least two alternatively arranged layers of, firstly, carbon or ruthenium and, secondly, a carbide or a boride or a material from the group silicon carbide, silicon nitride, boron carbide or carbon are provided below the topmost layer. With the aid of the protective layer system, the multilayer system arranged underneath is intended to be protected in particular against reactive hydrogen having a kinetic energy of a few hundred electronvolts, which could otherwise penetrate into the multilayer coating and lead there to detachment of the topmost layers, in particular of silicon layers.

SUMMARY

It is an object of the invention to provide an optical element for EUV lithography and an optical system comprising said optical element which can be used in the presence of reactive hydrogen. It is also an object of the invention to specify a method for treating an optical element which enables permanent operation of the optical element in the presence of reactive hydrogen.

This object is achieved by an optical element comprising an EUV radiation reflecting multilayer system, and a protective layer system applied to the multilayer system and having at least a first and a second layer, wherein the first layer, which is situated closer to the multilayer system, has a lower solubility for hydrogen than the second layer, which is further away from the multilayer system.

With a protective layer system having sufficient thickness, the layers of the multilayer system can be effectively protected and layer detachment can be prevented. This relates, in particular, to layers of pure silicon, which are typically attacked by penetrating reactive hydrogen to a particularly great extent since the arising of silane compounds and/or the recombination of reactive (atomic/ionic) hydrogen occur(s) there, resulting in blistering and layer detachment associated therewith.

The inventors have recognized that for ensuring the long-term stability of optical elements exposed to reactive hydrogen, it is not sufficient if only the multilayer system is protected against the reactive hydrogen with the aid of a protective layer system having sufficient thickness, since the layers or the materials of the protective layer system which are permanently exposed to reactive hydrogen may also experience blistering or layer detachment. Stated generally, any material exhibits blistering or layer detachment if the hydrogen fluence is high enough. The frequency of the occurrence of blistering is dependent on the material used, wherein blistering typically occurs more frequently in the case of materials having a low solubility for hydrogen than in the case of materials having a high solubility for hydrogen.

It is therefore proposed to use a protective layer system having a first layer and a second layer having different solubilities for hydrogen. The second layer, which is arranged further away from the multilayer system and therefore nearer to the optical surface which forms the interface with the environment, is exposed to reactive hydrogen to an increased extent and therefore has a comparatively high solubility for hydrogen and thus a low tendency toward blistering for example as a result of the formation of hydrides. By contrast, the first layer, which is situated closer to the multilayer system and which can in particular adjoin the topmost layer thereof, has a comparatively low solubility for hydrogen and thus a higher tendency toward blistering. On the other hand, materials having a low solubility for hydrogen are better hydrogen barriers than materials having a higher solubility for hydrogen, as a result of which the hydrogen diffusion into the multilayer system is reduced.

The use of the second layer, having a high solubility for hydrogen, makes it possible to absorb hydrogen atoms which either diffuse in from the optical surface (the interface with the vacuum) or are implanted in the material of the protective layer system on account of their high kinetic energy. The first layer, having a higher tendency toward blistering, is protected by the absorption of hydrogen by the second layer. The first layer serves as a hydrogen barrier for significantly reducing or preventing further diffusion of hydrogen into the underlying multilayer system. In this way it is possible to provide a protective layer system which is still stable in the presence of reactive hydrogen even after a number of for example 20-70 gigapulses of the light source of an EUV lithography apparatus.

In one embodiment, the following holds for the solubility $s_1$ of the first layer: $\ln (s_1)<3$, preferably $\ln (s_1)<1$, and/or the following holds for the solubility $s_2$ of the second layer: $\ln (s_2)>5$, preferably $\ln (s_2)>7$. The solubility s (or $s_1$, $s_2$) is defined for hydrogen under atmospheric pressure and denotes the volume of (molecular) hydrogen (in cubic centimeters) which is taken up by 100 grams of the hydrogen-absorbing material. For details regarding this definition, reference is made to the article "A Theoretical Formula for the Solubility of Hydrogen in Metals" by R. H. Fowler et al., Proc. R. Soc. Lond. A 160, page 37 et seq. (1937), which is incorporated by reference in its entirety in the content of this application. It should be pointed out that the solubility s is temperature-dependent, as is evident for example from FIG. 1 of the cited article. The values indicated here relate to temperatures (in kelvins) for which the following holds true: $10\ 000/16=625$ K (cf. FIG. 1), i.e. for temperatures of approximately 350° C. or less.

In one embodiment, the first layer is formed from an amorphous or monocrystalline material. In order that the first layer can effectively fulfill its function as a diffusion barrier, it has proved to be advantageous if said layer is formed from a (compact) amorphous or monocrystalline material, which preferably has no pores and no internal grain boundaries. Both the presence of pores and the presence of grain boundaries, such as occur for example in the case of polycrystalline material, can impair the long-term durability of the first layer since blistering can occur to an increased extent in the pores and/or at the grain boundaries.

In a further embodiment, the first layer is formed from a material selected from the group consisting of: Mo, Ru, Ir, Ni, Fe, Co, and Cu. For these materials it is known that they have a low solubility for (molecular) hydrogen, such that these materials can effectively prevent the diffusion of hydrogen to the reflective multilayer system. Further materials can also be used for the first layer, in particular layers which have an (even) lower diffusion coefficient for hydrogen or an even lower solubility for molecular hydrogen.

In a further embodiment, the first layer has a thickness of between 0.3 nm and 10 nm, preferably between 0.3 nm and 2 nm. A thickness of the first layer which lies within the interval indicated typically makes it possible, on the one hand, for the diffusion of hydrogen into the multilayer system to be effectively prevented and, on the other hand, for the reflectivity of the optical element not to be reduced too much.

In a further embodiment, the second layer is formed from a polycrystalline and/or open-pored material; if appropriate, however, the second layer can also be formed from a material having closed pores. A polycrystalline material has grain boundaries to which hydrogen can attach, such that the solubility for hydrogen can be increased relative to an e.g. amorphous or monocrystalline structure. The provision of a material having a polycrystalline and/or open-pored structure constitutes one possibility for producing defects or defect networks in the material to which hydrogen atoms can attach.

The structure of the material of the second layer, if appropriate, can also be varied in a manner different from that illustrated here, in order to increase the attachment of hydrogen atoms and thus the solubility for hydrogen. In the case of materials which already have a high solubility for hydrogen without the presence of defects, blistering is typically reduced even in the case of a polycrystalline and/or porous structure, since, in the case of these materials, blistering is typically associated with the formation of hydrides and the blisters generally do not form in the pores or at the defect centers.

Particular preference is given to the use of a sponge-like, open-pored structure, wherein the number and/or the size of the pores can increase, if appropriate, proceeding from that side of the second layer which faces the multilayer system toward that side of the second layer which faces the optical surface (interface with the environment). In other words, the second layer can have a gradient with regard to the (open) pores. The open pores can form channels which make it possible that the absorbed hydrogen is transported upward (i.e. toward the interface with the environment (vacuum)) and can escape from the protective layer system, as a result of which it is possible to prevent the hydrogen-absorbing layer from experiencing hydrogen saturation. In this regard, the article "High Reflective Mirrors for In-vessel Applications in ITER" by A. G. Razdobarin et al., Nuclear Instruments and Methods in Physics Research A623 (2010), 809-811, for example, has disclosed the fact that a layer of $ZrO_2$ having acicular pores across the entire thickness of the layer has a low permeability for heavy hydrogen (deuterium).

In a further embodiment, the second layer is formed from a material selected from the group consisting of: Zr, Ti, Th, V, and Pd. For these materials it is known that they have a high solubility for (molecular) hydrogen, such that these materials promote the absorption or incorporation of hydrogen. Further materials can also be used for the second layer, in particular those which have an even higher solubility for molecular hydrogen.

In a further embodiment, the second layer has a thickness of between 5 nm and 25 nm. For the case where the second layer has an open-pored structure, the absorption of EUV radiation is lower in comparison with a completely closed (pore-free) layer, such that the second layer can also have a comparatively large thickness of up to approximately 25 nm, without the reflectivity of the optical element being impaired to an excessively great extent.

In a further embodiment, the second layer has a thickness of between 10 nm and 15 nm. For most materials, the penetration depth of hydrogen ions having high kinetic energies in the range of approximately 100 eV, such as can occur in proximity to the collector mirror, is not more than approximately 5 nm to 15 nm, the exact value depending on the ion energy and the material of the layer. As has been found in computer simulations, a second layer having a thickness in the range indicated above can take up or absorb the majority of the implanted hydrogen ions. The implanted hydrogen ions can diffuse from the implantation location further into the protective layer system, the diffusion being dependent on factors such as concentration differences, electric field gradients, pressure gradients, etc. However, the diffusion of hydrogen ions is stopped at the first layer, serving as a diffusion barrier, and so said ions cannot penetrate into the multilayer system.

A further aspect of the invention relates to an optical element of the type mentioned in the introduction which can be designed in particular as described further above. In the optical element, the protective layer system has a third, topmost layer formed from a material having, at a temperature of 350 K, a recombination rate for hydrogen which is more than $10^{-27}$ cm$^4$/(atom s), in particular more than $10^{-19}$ cm$^4$/(atom s).

Besides the implantation of hydrogen ions as described further above, there is also a second route via which hydrogen can penetrate into the protective layer system and possibly into the underlying multilayer system, specifically by adsorption of hydrogen atoms or hydrogen molecules at the optical surface which forms the interface with the residual gas environment in which the optical element is operated. The hydrogen molecules adsorbed at the optical surface dissociate to form hydrogen atoms which can diffuse into the topmost layer of the protective layer system and into the underlying layers for example as a result of diffusion within the lattice or as a result of diffusion at the grain boundaries. During such a diffusion process, the hydrogen atoms can be stopped or trapped at defect sites (e.g. at imperfections, dislocations, unsaturated bonds, etc.).

In order that the diffusion of hydrogen into the protective layer system by the route described above is prevented to the greatest possible extent, the inventors propose producing a third, topmost layer of the protective layer system from a material which has a high recombination rate for hydrogen. The recombination rate indicates how likely it is that hydrogen atoms adsorbed at the surface will recombine to form hydrogen molecules and be removed from the surface. A high recombination rate is thus advantageous in order to suppress the indiffusion of hydrogen via the optical surface and to promote the outdiffusion of hydrogen. The recombination rate of a plurality of transition metals is known from the article "A Model for Atomic Hydrogen-metal Interactions", by M. A. Pick, K. Sonnenberg, Journal of Nuclear Materials 131 (1985), pp. 208-220, for example, and is dependent on temperature. The values indicated above with regard to the recombination rate relate to a temperature of 350 K. Contamination attached to the surface can greatly influence the recombination rate. The values indicated above are indicated for a surface free of contamination.

In one embodiment, the material of the topmost layer is selected from the group consisting of: Mo, Ru, Cu, Ni, Fe, Pd, V, Nb and the oxides thereof. Materials having a high recombination rate for hydrogen are typically materials which absorb or adsorb hydrogen endothermically, which is the case for example for the materials described above. The list of materials indicated above is not complete; other materials can be used for the topmost layer, in particular materials which have an even higher recombination rate for hydrogen.

The selection of a material for the topmost layer is also dependent on the magnitude of the affinity of the material for contaminations in the residual gas environment which are attached to the surface of the topmost layer. By way of example, for the case where the optical element is used in proximity to the EUV light source and is exposed to contaminations in the form of tin or generally metal hydride compounds, it is possible to choose a material for the topmost layer to which the corresponding contaminations are attached only to a small extent, such that the recombination rate for hydrogen does not decrease, or decreases only slightly, even in the presence of the contaminations present in the gas phase. This is the case particularly for oxides, specifically for metal oxides, particularly for transition metal oxides. When selecting a suitable oxide as material for the topmost layer, consideration should be given to ensuring that it has a sufficiently high recombination rate for hydrogen (see above).

In one embodiment, the first layer, the second layer and/or the third layer are/is formed from a metal or a metal oxide, in particular from a transition metal or a transition metal oxide. The use of a metal having low internal stress is advantageous since hydrogen can be attached to lattice sites at which tensile stresses occur, which promotes recombination to form molecular hydrogen and thus the formation of hydrogen blisters. The interfaces between the individual layers, in particular the interface between the first layer and the second layer, should also have a high quality and a very small number of interfacial defects, in order to avoid imperfections, unsaturated bonds, etc., at which hydrogen can accumulate, which would lead to recombination to form molecular hydrogen and thus to the formation of blisters at the interface. Such defects at the interface can be avoided to the greatest possible extent with the use of two metallic materials for the first layer and the second layer, which, if appropriate, have even further structural commonalities e.g. with regard to their lattice structure or their lattice spacings. However, appropriate layer materials for the individual layers include not only metals but also other materials for which, if appropriate, the formation of defects in the material and/or at the interfaces is likewise low, such that they have a high structural stability. If appropriate, it is also possible to use mixtures of two or more materials for producing individual or all layers of the protective layer system.

In one embodiment, the optical element is designed as a collector mirror. In EUV lithography, collector mirrors are often used as the first mirror in the ray direction downstream of the radiation source, in particular a plasma radiation source, in order to collect the radiation emitted in different directions by the radiation source and to reflect it in a concentrated fashion to the next mirror. Owing to the high radiation intensity in the vicinity of the radiation source, it is particularly highly likely there that molecular hydrogen present in the residual gas atmosphere can be converted into reactive (atomic or ionic) hydrogen having high kinetic energy, such that precisely collector mirrors are particularly at risk of exhibiting detachment phenomena at the layers of the protective layer system or at the upper layers of their multilayer system on account of penetrating reactive hydrogen.

A further aspect of the invention relates to an optical system for EUV lithography comprising at least one optical element as described above. The optical system can be an EUV lithography apparatus for exposing a wafer or some other optical system which uses EUV radiation, for example a system for measuring masks used in EUV lithography, or the like.

A further aspect of the invention relates to a method for treating an optical element comprising a substrate, an EUV radiation reflecting multilayer system applied to the substrate, and a protective layer system applied to the multilayer system, the method comprising: treating the optical element in order to extract incorporated hydrogen from at least one layer of the protective layer system and/or at least one layer of the multilayer system.

The optical element, to put it more precisely its protective layer system, can be designed in the manner described further above. However, this is not absolutely necessary for carrying out the method. If the optical element is situated in a residual gas atmosphere comprising (activated/reactive) hydrogen for an excessively long time, starting from a specific point in time the hydrogen concentrations in the individual layers can become so high that this has catastrophic consequences for the structural stability of the optical element, specifically of the protective layer system or of the multilayer system. Therefore, from time to time or at specific intervals the optical element should be subjected to a treatment which removes the incorporated hydrogen at least partly from the layers by virtue of said hydrogen being transported to the optical surface, from which it can be released into the environment. There are a number of possibilities for the treatment of the optical element:

In one variant, the removal of incorporated hydrogen comprises heating the optical element to a temperature of more than 50° C., preferably of more than 100° C. Such a thermal treatment can promote an activation of the hydrogen or a transport of the hydrogen through the optical surface or into the layers having high hydrogen solubility. There are also other possibilities for the treatment of the optical element which produce the desired effect of removing hydrogen from the respective layers. By way of example, the incorporated hydrogen can, if appropriate, also be removed from the layers of the protective layer system and, if appropriate, from the layers of the multilayer system by an electric field which promotes diffusion in the direction of the optical surface, wherein in this case the incorporated hydrogen should typically be present in the form of ionic or ionized hydrogen.

Further features and advantages of the invention are evident from the following description of exemplary embodiments of the invention, with reference to the figures of the drawing, which show details essential to the invention, and from the claims. The individual features can each be realized individually by themselves or as a plurality in arbitrary combination in a variant of the invention.

BRIEF DESCRIPTION OF THE DRAWINGS

Exemplary embodiments are illustrated in the schematic drawing and are explained in the description below. In the figures.

DETAILED DESCRIPTION

In the following description of the drawings, identical reference signs are used for identical or functionally identical components.

Figure 1:
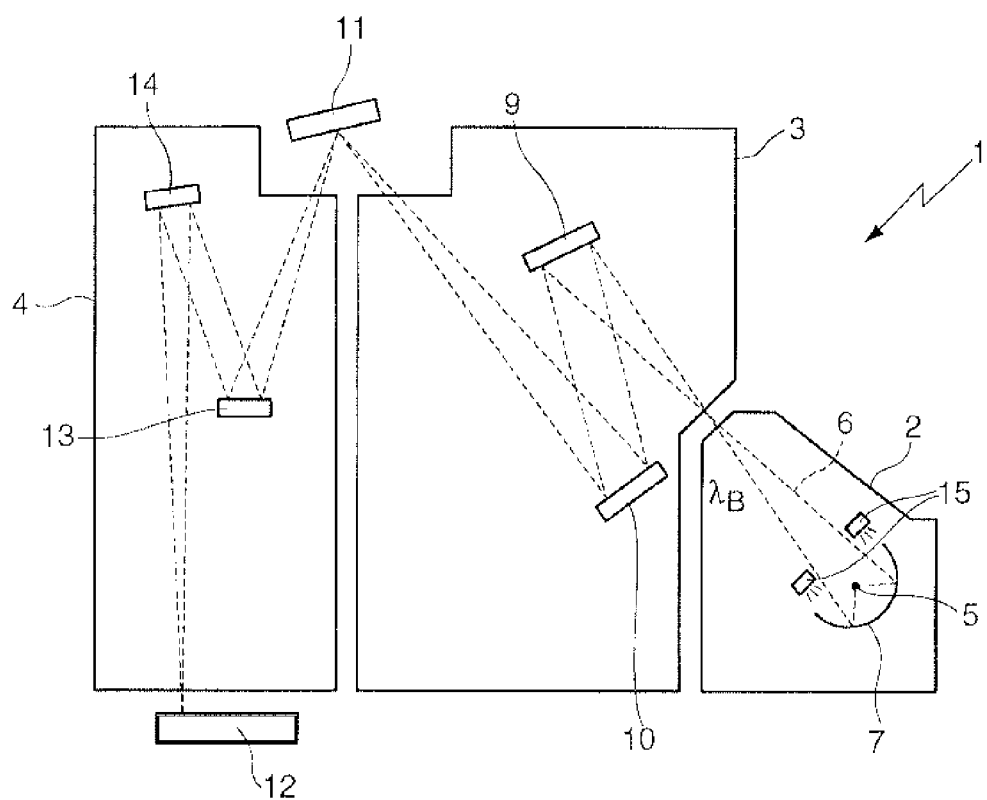
FIG. 1 shows a schematic illustration of an EUV lithography apparatus.

FIG. 1 schematically shows an optical system for EUV lithography in the form of a projection exposure apparatus 1. The projection exposure apparatus 1 comprises a beam generating system 2, an illumination system 3 and a projection system 4, which are accommodated in separate vacuum housings and are arranged successively in a beam path 6 proceeding from an EUV light source 5 of the beam shaping system 2. By way of example, a plasma source or a synchrotron can serve as EUV light source 5. The radiation emerging from the light source 5 in the wavelength range of between approximately 5 nm and approximately 20 nm is firstly concentrated in a collector mirror 7 and the desired operating wavelength $\lambda_B$, which is approximately 13.5 nm in the present example, is filtered out with a monochromator (not shown).

The radiation treated with regard to wavelength and spatial distribution in the beam generating system 2 is introduced into the illumination system 3, which has a first and second reflective optical element 9, 10 in the present example. The two reflective optical elements 9, 10 guide the radiation onto a photomask 11 as further reflective optical element, which has a structure which is imaged onto a wafer 12 on a reduced scale by the projection system 4. For this purpose, a third and fourth reflective optical element 13, 14 are provided in the projection system 4. It should be pointed out that both the illumination system 3 and the projection system 4 can in each case have only one or else three, four, five or more reflective optical elements.

The structure of an optical element 50 such as can be realized on one or more of the optical elements 7, 9, 10, 11, 13, 14 of the projection exposure apparatus 1 from FIG. 1 is illustrated by way of example below with reference to FIG. 2. The optical element 50 has a substrate 52 consisting of a substrate material having a low coefficient of thermal expansion, e.g. composed of Zerodur®, ULE® or Clearceram®. In the case of the reflective optical element 50 illustrated in FIG. 2, a multilayer system 51 is applied to the substrate 52. The multilayer system 51 has alternatively applied layers of a material having a higher real part of the refractive index at the operating wavelength $\lambda_B$ (also called spacer 55) and of a material having a lower real part of the refractive index at the operating wavelength $\lambda_B$ (also called absorber 54), wherein an absorber-spacer pair forms a stack 53. This construction of the multilayer system 51 in a certain way simulates a crystal whose lattice planes correspond to the absorber layers at which Bragg reflection takes place.

The thicknesses of the individual layers 54, 55 and of the repeating stacks 53 can be constant or else vary over the entire multilayer system 51, depending on what spectral or angle-dependent reflection profile is intended to be achieved. The reflection profile can also be influenced in a targeted manner by the basic structure composed of absorber 54 and spacer 55 being supplemented by further more and less absorbent materials in order to increase the maximum possible reflectivity at the respective operating wavelength $\lambda_B$. For this purpose, absorber and/or spacer materials can be exchanged for one another in some stacks 53 or the stacks can be constructed from more than one absorber and/or spacer material. The absorber and spacer materials can have constant or else varying thicknesses over all the stacks 53 in order to optimize the reflectivity. Furthermore, it is also possible to provide additional layers for example as diffusion barriers between spacer and absorber layers 55, 54.

In the present example, in which the optical element 50 was optimized for an operating wavelength $\lambda_B$ of 13.5 nm, i.e. in the case of an optical element 50 which has the maximum reflectivity for substantially normal incidence of radiation at a wavelength of 13.5 nm, the stacks 53 of the multilayer system 51 have alternate silicon and molybdenum layers. In this case, the silicon layers correspond to the layers 55 having a higher real part of the refractive index at 13.5 nm, and the molybdenum layers correspond to the layers 54 having a lower real part of the refractive index at 13.5 nm. Other material combinations such as e.g. molybdenum and beryllium, ruthenium and beryllium or lanthanum and $B_4C$ are likewise possible, depending on the exact value of the operating wavelength $\lambda_B$.

Figure 2:
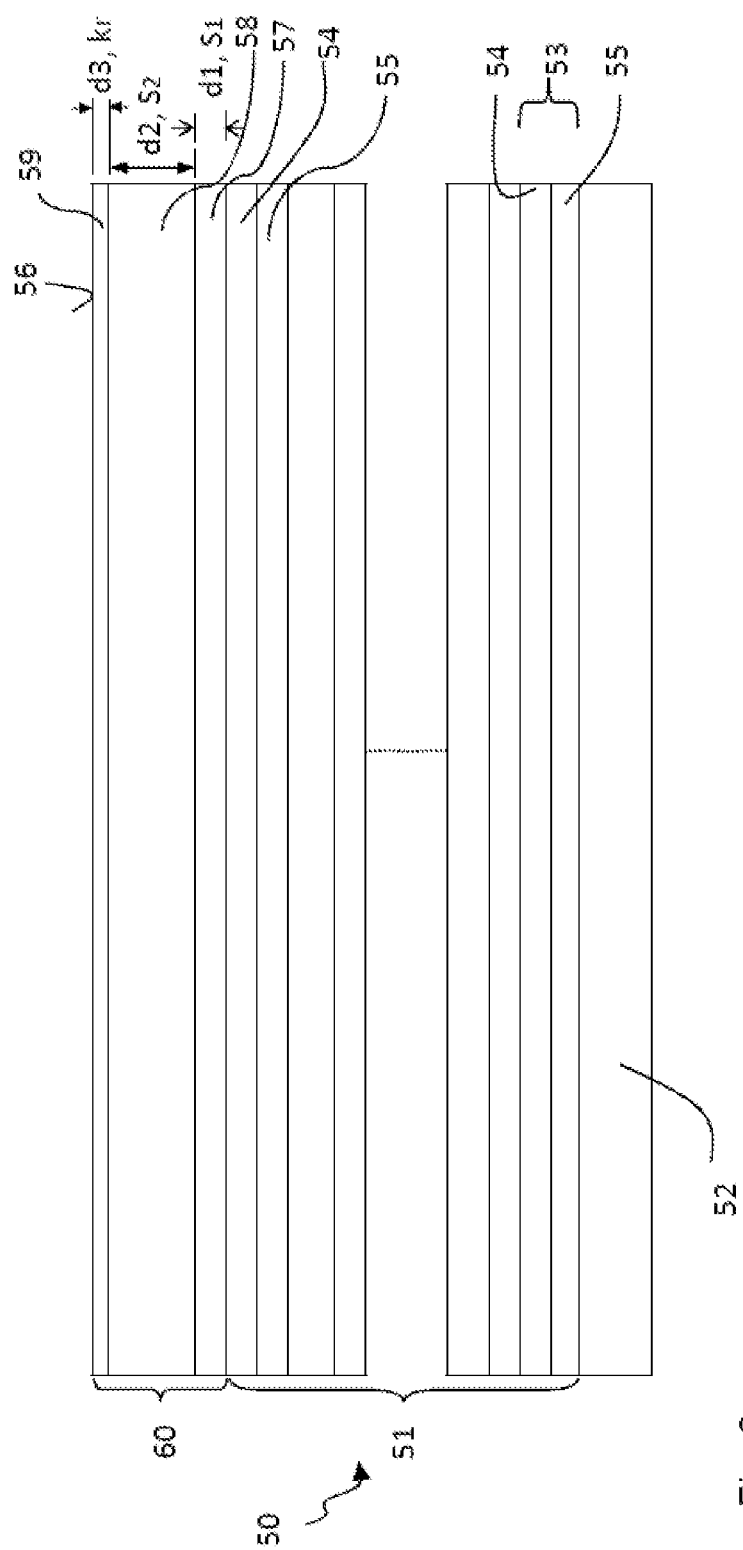
FIG. 2 shows a schematic illustration of an optical element for the EUV lithography apparatus from FIG. 1, which optical element comprises a protective layer system having three layers.

The reflective optical element 50 from FIG. 2 has an optical surface 56 forming the interface with the vacuum environment. In the projection exposure apparatus 1, the optical element 50 is operated under vacuum conditions in a residual gas atmosphere in which typically a small proportion of oxygen, a proportion of reactive hydrogen and, if appropriate, a proportion of tin are present. Tin compounds (or generally metal hydride compounds) can occur, in particular, if the light source 5 generates EUV radiation on the basis of a tin plasma and the optical element 50 is arranged in proximity to the light source 5, for example if the optical element 50 is the collector mirror 7.

In order to protect the optical element 50 against these and possibly against further contaminating substances, in the example shown in FIG. 2, a protective layer system 60 is applied to the multilayer system 51, said protective layer system consisting of a first layer 57, a second layer 58 and a third layer 59 in the present example. The first layer 57 (having thickness d1) of the protective layer system 60 is arranged in a manner directly adjoining the topmost layer 54 of the multilayer system 51. The second layer 58 (having thickness d2) is applied directly to the first layer 57. The termination of the protective layer system 60 with respect to the optical surface 56 is formed by the third, topmost layer 59 (having thickness d3), which is applied directly to the second layer 58.

It should be pointed out that the protective layer system 60 can also have more than three layers, for example four, five or more layers. It should also be pointed out that between the layers of the protective layer system 60 if appropriate additional (thin) layers can be arranged which counteract a mixing of two adjacent layers 57, 58, 59, for example by performing the function of a diffusion barrier. Moreover, the protective layer system 60 can, if appropriate, comprise only the first and second layers 57, 58.

The three layers 57, 58, 59 of the protective layer system 60 have different functions: the first, bottommost layer 57 serves as a diffusion barrier in order to prevent or significantly reduce the diffusion of hydrogen from the second and/or the third layer 58, 59 into the underlying multilayer system 51. In order to achieve this, the first layer 57 has a low diffusion coefficient for hydrogen. Such a low diffusion coefficient is typically present in the case of materials which have a low solubility $s_1$ for (molecular) hydrogen, wherein the following typically holds for the material of the first layer 57: ln $(s_1)$<3 or ln $(s_1)$<1, in particular ln $(s_1)$<0.

The solubility $s_1$ is defined for hydrogen under atmospheric pressure and denotes the volume of (molecular) hydrogen (in cubic centimeters) which is taken up by 100 grams of the hydrogen-absorbing material. The above condition with regard to the solubility for hydrogen is fulfilled for example for materials selected from the group comprising: Mo, Ru, Ir, Ni, Fe, Co, Cu. The thickness d1 of the first layer 57 is typically between approximately 0.3 nm and 10 nm, preferably between 0.3 nm and 2 nm.

The first layer 57 protects the underlying multilayer system 51, in particular the silicon layers 55, against hydrogen which can lead to blistering and, if appropriate, layer detachment of the layers 55 and/or 54 of the multilayer system 51. The comparatively low solubility $s_1$ of the first layer 57 for hydrogen could indeed have the effect, if appropriate, that blistering commences to an increased extent in the first layer 57 itself and leads to layer detachment. Blisters that can lead to layer detachment are formed generally at pores or at imperfections in the case of materials having low solubility for hydrogen. Therefore, it is advantageous if the first layer 57 is as free as possible of pores or imperfections which can be ensured, in particular, if the first layer consists of an amorphous material or of a monocrystalline material. The first layer 57 should also be as compact as possible in order to prevent the diffusion of hydrogen into the underlying multilayer system 51 as completely as possible.

Besides the diffusion of hydrogen into the protective layer system 60 via the optical surface 56, hydrogen can also be implanted in the form of hydrogen ions or hydrogen radicals into the protective layer system 60. This is the case particularly in proximity to the light source 5, since ionized hydrogen atoms or hydrogen radicals are present there which can have a high kinetic energy which can be approximately 100 eV or more.

Figure 3A:
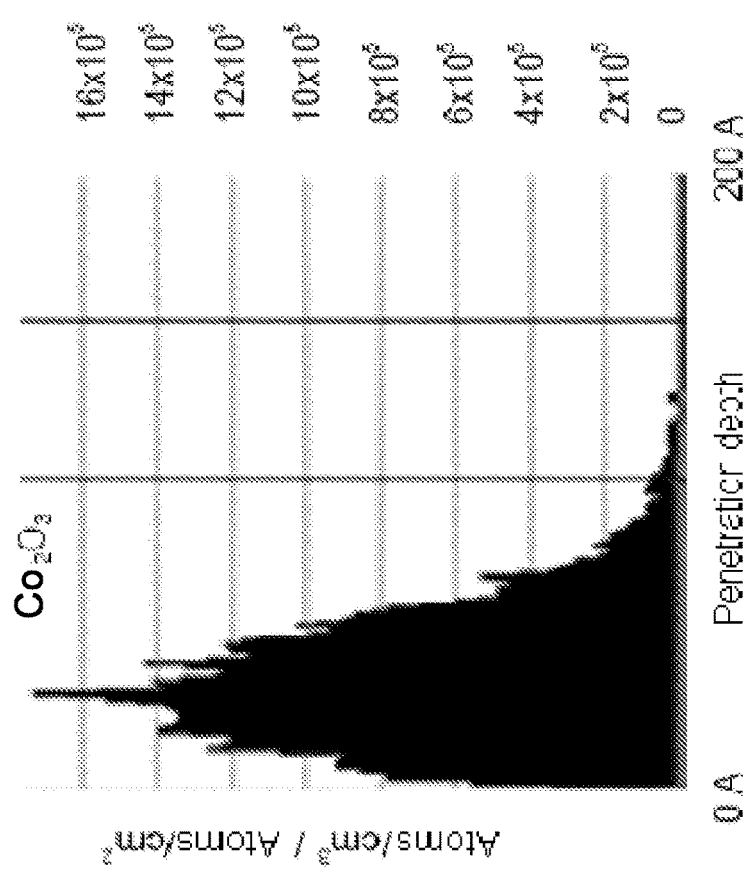
FIGS. 3A and 3B show illustrations of the penetration depth of hydrogen ions into a layer composed of $Ce_2O_3$ and composed of $MoSi_2$, respectively.
Figure 3B:
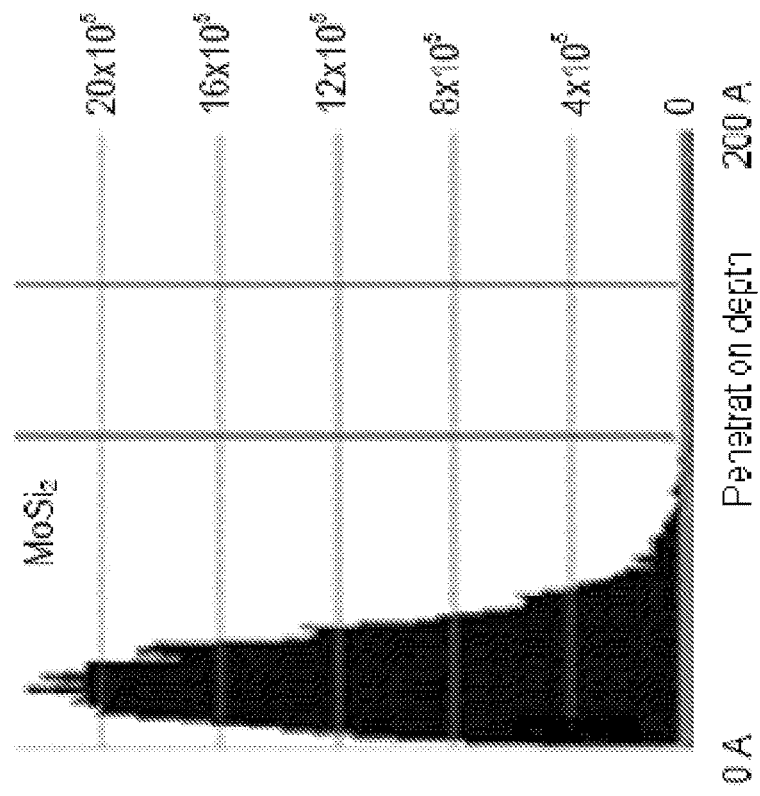

The penetration depth of reactive hydrogen into the protective layer system 60 is material-dependent and is typically of the order of magnitude of approximately 10 nm to approximately 15 nm, as has been found on the basis of computer simulations for the penetration depth into different materials. By way of example, a result of such a simulation for $Ce_2O_3$ is illustrated in FIG. 3a. Although there are also materials for which the penetration depth of reactive hydrogen practically does not exceed 10 nm (corresponding to 100 angstroms), as shown by the result of a further simulation in FIG. 3b by way of example for $MoSi_2$, the influence of the material used on the penetration depth of reactive hydrogen is rather low overall, particularly if metallic materials or their oxides (i.e. metal oxides) are used as materials for the layers 57, 58, 59.

In order largely to prevent implantation of hydrogen ions into the first layer 57, it has proved to be advantageous if the second layer 58 has a thickness of between approximately 5 nm and 25 nm, in particular between approximately 10 nm and approximately 15 nm, the exact value depending on the penetration depth of hydrogen into the corresponding layer material, in which case the loss of reflectivity for EUV radiation must also be taken into account, said loss increasing with thickness.

In order that blistering as a result of the implantation of hydrogen into the second layer 58 is prevented to the greatest possible extent, the second layer 58 has a higher solubility $s_2$ for hydrogen than the first layer 57, wherein it is advantageous if the following holds true for the solubility $s_2$ for hydrogen of the second layer 58: $\ln(s_2) > 5$, in particular $\ln(s_2) > 7$. This condition is fulfilled for example for materials selected from the group comprising: Zr, Ti, Th, V, Pd. In the case of materials having a high solubility for hydrogen, blistering typically takes place as a result of the formation of (metal) hydrides, wherein the tendency toward blistering is typically significantly reduced with high solubility for hydrogen compared with materials having lower solubility for hydrogen.

With regard to the structure of the second layer 58 it has proved to be advantageous if the latter is formed from a polycrystalline and/or open-pored material. A polycrystalline material has grain boundaries to which hydrogen can be attached, such that the solubility for hydrogen of a material of which the second layer consists can be increased compared with an e.g. amorphous or monocrystalline structure. Hydrogen can also be incorporated in the pores of an open-pored material (or, if appropriate, of a material having closed pores). The use of an open-pored material in the manner of a sponge, in particular the use of a material in which the open pores form channels extending along the thickness direction of the second layer 58, has proved to be advantageous since, in this case, the hydrogen implanted into the material of the second layer 58 is transported in a particularly simple manner by diffusion upward, i.e. to the optical surface 56, and from there can escape from the protective layer system 60. This makes it possible, in particular, to prevent the hydrogen-absorbing second layer 58 from experiencing hydrogen saturation.

In order to promote the emergence of hydrogen from the protective layer system 60, the third, topmost layer 59 is formed from a material having, at a temperature of 350 K, a recombination rate $k_r$ for hydrogen which is more than $10^{-27}$ cm$^4$/(atoms s), in particular more than $10^{-19}$ cm$^4$/(atoms s). The recombination rate $k_r$ indicates how likely it is that hydrogen atoms/ions/radicals adsorbed at the surface will recombine to form hydrogen molecules and be removed from the surface. A high recombination rate is thus advantageous in order to suppress the indiffusion of hydrogen via the optical surface 56 and to promote the outdiffusion of hydrogen through the optical surface 56.

In particular, the high recombination rate $k_r$ can prevent a situation in which, as a result of an adsorption of hydrogen atoms or hydrogen molecules at the optical surface 56 forming the interface with the residual gas environment, hydrogen atoms can diffuse into the topmost layer 59 of the protective layer system and into the underlying layers 57, 58.

Materials having a high recombination rate for hydrogen are typically materials which absorb or adsorb hydrogen endothermically, which is the case for example for materials selected from the group consisting of: Mo, Ru, Cu, Ni, Fe, Pd, V, Nb, or selected from the oxides of these materials.

The selection of a suitable material for the topmost layer 59, at which the optical surface 56 is formed, is also dependent on how high the likelihood is that contaminating substances present in the residual gas environment of the optical element 50 will be attached to the optical surface 56 of the respective material, since the recombination rate $k_r$ for hydrogen depends on the degree of contamination of the optical surface 56 and decreases as the degree of contamination increases. Therefore, for example for the case where the optical element 50 is used in proximity to the EUV light source 5 and is exposed to contaminations in the form of tin or generally metal hydride compounds, it is possible to choose a material for the topmost layer 59 to which the corresponding contaminations are attached only to a small extent, such that the recombination rate $k_r$ for hydrogen does not decrease, or decreases only slightly, as a result of contaminations at the optical surface 56. By way of example, for Ru as layer material it is known that this has a comparatively high tendency toward tin being attached to the optical surface 56, such that this material—unless corresponding cleaning is effected—should not be used for optical elements 50 in proximity to the EUV light source 5 if the latter generates EUV radiation with a tin plasma.

If appropriate, the optical element 50 can also have a protective layer system 60 which has a topmost layer 59 having the properties described here and which has no, one or a plurality of further layers which do not have the properties of the first layer 57 and the second layer 58 described further above. The interfaces between the layers 57, 58, 59, in particular between the first layer 57 and the second layer 58, should have the smallest possible number of defects in order to prevent hydrogen from being attached there and blistering from commencing at the interface. The reduction of the number of defects can be achieved by reducing the particle loading during the application of the coating or the layers 57, 58, 59, e.g. by the coating being applied under clean room conditions. If appropriate, during the coating or after the conclusion of the application of a respective layer 57, 58, 59, smoothing methods can also be carried out in order to reduce the number of defects. Control of the kinetic energy of the layer-forming particles during coating can also contribute to reducing the number of defects. Moreover, the layers 57, 58, 59 used should have the lowest possible internal stresses. Typically, only materials which can be applied by a conventional coating process, in particular by vapor deposition, are used for the layers 57, 58, 59.

In the case also of an optical element 50 having a protective layer system 60 which is embodied in the manner described further above in association with FIG. 2 and which is arranged over an excessively long period of time in a residual gas atmosphere comprising activated hydrogen or comprising a hydrogen plasma, for example in proximity to the EUV light source 5, the situation can occur that at a specific point in time the hydrogen concentrations in the individual layers 57, 58, 59 of the protective layer system and, if appropriate, the layers 54, 55 of the multilayer system 51 become so high that layer removal or delamination occurs, which can lead to a drastic reduction of the reflectivity of the optical element 50.

From time to time or at specific intervals, therefore, a treatment of the optical element 50 may be advisable in order to remove incorporated hydrogen at least partly from the layers 57, 58, 59 of the protective layer system 60 and, if appropriate, the layers 54, 55 of the multilayer system 51. FIG. 1 shows, by way of example, a treatment device for treating the collector mirror 7, which device serves as a temperature-regulating device 15 and, in the present example, is designed as an IR emitter for applying thermal radiation to the collector mirror 7, to put it more precisely to the optical surface 56 thereof (cf. FIG. 2), such that the thermal radiation can act directly on the protective layer system or on the multilayer system in order to heat it to temperatures of more than 50° C., preferably of more than 100° C., and thus to bring about the transport of hydrogen from the layers 57, 58, 59 of the protective layer system 60 to the optical surface 56, from where the incorporated hydrogen can be released into the environment.

In addition or as an alternative to a thermal treatment of the optical element 50 there are further possibilities for treating the optical element 50 which enable the hydrogen to be transported to the optical surface 56 in order to remove said hydrogen from the protective layer system 60 or from the multilayer system 51. For example, an electric field which promotes the diffusion of hydrogen in the direction of the optical surface 56 can be used, if the hydrogen is present in ionized form. During the thermal treatment or a differently configured treatment of the optical element 50, it is possible, in particular, for the hydrogen incorporated or absorbed in the second layer 58 to be at least partly liberated, with the result that it is possible to prevent the hydrogen-absorbing second layer 58 from experiencing hydrogen saturation.

To summarize, permanent operation of an optical element 50 in the presence of reactive hydrogen is made possible in the manner described above, since in addition to the multi-layer system 51, in the case of the protective layer system 60, too, blistering on account of incorporated or implanted hydrogen occurs—if at all—only in a delayed fashion, i.e. over a very long time scale, which ideally corresponds to the service life of the EUV lithography apparatus 1 or of the optical system for EUV lithography in which the optical element 50 is installed and operated. Given a suitable choice of the properties of the three layers 57, 58, 59, in particular in the case of a second layer 58 having a porous structure, the reflectivity of the optical element 50 is reduced only to a comparatively small extent by the protective layer system 60.

What is claimed is:
1. Optical element, comprising:
   a substrate,
   an extreme ultraviolet (EUV) radiation reflecting multi-layer system applied to the substrate, and
   a protective layer system applied to the multilayer system and having at least a first and a second layer,
   wherein the first layer is arranged closer to the multilayer system than is the second layer,
   wherein the first layer has a lower solubility for hydrogen than does the second layer,
   wherein the first layer is formed from an amorphous or monocrystalline material, and
   wherein: $\ln(s_1) < 3$, where $s_1$ is the solubility for hydrogen of the first layer, and/or $\ln(s_2) > 5$, where $s_2$ is the solubility for hydrogen of the second layer,
   wherein the first layer is formed from a material selected from the group consisting of: Ru, Ir, Ni, Fe, Co, Cu.
2. The optical element according to claim 1, wherein the first layer has a thickness (d1) of between 0.3 nm and 10 nm.
3. The optical element according to claim 1, wherein the second layer is formed from a polycrystalline material and/or from an open-pored material.
4. The optical element according to claim 1, wherein the second layer is formed from a material selected from the group consisting of: Zr, Ti, Th, V, Pd.
5. The optical element according to claim 1, wherein the second layer has a thickness (d2) of between 5 nm and 25 nm.
6. The optical element according to claim 5, wherein the second layer has a thickness (d2) of between 10 nm and 15 nm.
7. The optical element as claimed in claim 1,
   wherein the protective layer system additionally has a third layer, and
   wherein the third layer is formed from a material having, at a temperature of 350 K, a recombination rate ($k_r$) for hydrogen which is greater than $10^{-27}$ cm$^4$/(atom s).
8. The optical element according to claim 7, wherein the third layer is formed from a material selected from the group consisting of: Mo, Ru, Cu, Ni, Fe, Pd, V, Nb and the oxides thereof.
9. The optical element according to claim 7, wherein at least one of the first layer, the second layer or the third layer is formed from a metal or a metal oxide.
10. The optical element according to claim 1, configured as a collector mirror.
11. Optical system for extreme ultraviolet (EUV) lithography, comprising: at least one optical element according to claim 1.
12. The optical element according to claim 2, wherein the thickness (d1) of the first layer is between 0.3 nm and 2 nm.
13. The optical element according to claim 1, wherein a thickness (d1) of the first layer is between 0.3 nm and 2 nm.
14. The optical element according to claim 7, wherein the recombination rate ($k_r$) for hydrogen is greater than $10^{-19}$ cm$^4$/(atom s).
15. An optical element, comprising:
   a substrate,
   an extreme ultraviolet (EUV) radiation reflecting multi-layer system applied to the substrate, and
   a protective layer system applied to the multilayer system and having at least a first and a second layer,
   wherein the first layer is arranged closer to the multilayer system than is the second layer,
   wherein the first layer has a lower solubility for hydrogen than does the second layer,
   wherein the first layer is formed from an amorphous or monocrystalline material, and
   wherein $\ln(s_1) < 3$, where $s_1$ is the solubility for hydrogen of the first layer and $\ln(s_2) > 5$, where $s_2$ is the solubility for hydrogen of the second layer.
16. An optical element, comprising:
   a substrate,
   an extreme ultraviolet (EUV) radiation reflecting multi-layer system applied to the substrate, and a protective layer system applied to the multilayer system and having at least a first and a second layer, wherein the first layer is arranged closer to the multilayer system than is the second layer, wherein the first layer has a lower solubility for hydrogen than does the second layer at the same temperature of approximately 350° C., wherein the first layer is formed from an amorphous or monocrystalline material, wherein the second layer is formed from a polycrystalline material and/or from an open-pored material, and wherein: $\ln(s_1) < 3$, where $s_1$ is the solubility for hydrogen of the first layer, and/or $\ln(s_2) > 5$, where $s_2$ is the solubility for hydrogen of the second layer.

17. The optical element according to claim 1, wherein the second layer is formed from a polycrystalline material and/or from an open-pored material and wherein the $\ln(s_1) < 3$ and the $\ln(s_2) > 5$ at the same temperature.

* * * * *

UNITED STATES PATENT AND TRADEMARK OFFICE
CERTIFICATE OF CORRECTION

PATENT NO. : 10,690,812 B2
APPLICATION NO. : 14/854784
DATED : June 23, 2020
INVENTOR(S) : Bekman et al.

Page 1 of 1

It is certified that error appears in the above-identified patent and that said Letters Patent is hereby corrected as shown below:

In the Specification

Column 7, Line 63, Delete "element:" and insert -- element. --, therefor.

Column 9, Line 27, Delete "further more" and insert -- furthermore --, therefor.

In the Claims

Column 14, Line 35, In Claim 9, after "one of" delete "the first layer,".

Signed and Sealed this
First Day of December, 2020

Andrei Iancu
*Director of the United States Patent and Trademark Office*